(12) United States Patent
Pak et al.

(10) Patent No.: US 9,459,309 B2
(45) Date of Patent: Oct. 4, 2016

(54) TEST DEVICE, SEMICONDUCTOR DEVICE AND TESTING METHOD THEREOF

(71) Applicants: SK Hynix Inc., Icheon-si (KR); Korea Advanced Institute of Science and Technology, Daejeon (KR)

(72) Inventors: Jun-So Pak, Daejeon (KR); Jun-Ho Lee, Seongnam-si (KR); Joung-Ho Kim, Daejeon (KR)

(73) Assignees: SK HYNIX INC., Icheon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 392 days.

(21) Appl. No.: 13/945,819

(22) Filed: Jul. 18, 2013

(65) Prior Publication Data

US 2014/0049284 A1  Feb. 20, 2014

(30) Foreign Application Priority Data

Aug. 14, 2012 (KR) .................. 10-2012-0088725

(51) Int. Cl.
  *G01R 31/26* (2014.01)
  *G01R 31/319* (2006.01)
  *G01R 31/28* (2006.01)

(52) U.S. Cl.
  CPC ....... *G01R 31/2601* (2013.01); *G01R 31/2853* (2013.01); *G01R 31/31926* (2013.01)

(58) Field of Classification Search
  None
  See application file for complete search history.

(56) References Cited

U.S. PATENT DOCUMENTS

| | | | |
|---|---|---|---|
| 6,128,757 A * | 10/2000 | Yousuf et al. | 714/724 |
| 2009/0224784 A1* | 9/2009 | Pagani | 324/754 |
| 2012/0025846 A1 | 2/2012 | Minas et al. | |
| 2013/0002272 A1* | 1/2013 | Badaroglu et al. | 324/750.01 |
| 2014/0225624 A1* | 8/2014 | Chakrabarty et al. | 324/509 |

OTHER PUBLICATIONS

"Optimized Inverter Design of Ring Oscillator based Wafer-Level TSV Connectivity Test (RO-TSV-CT)" by Pak et al. May 2012 IEEE.*
"On-Chip TSV Testing for 3D IC before Bonding Using Sence Amplification" by Chen et al. 2009 IEEE.*
"A unified Method for Parametric Fault Characterization of Post-Boan TSVs" by Lin et al. Jan. 2012, IEEE.*
"Wafer-Level TSV Connectivity Test using Ring Oscillator Scheme" by Pak et al. Jul. 2012, IEEE.*

\* cited by examiner

*Primary Examiner* — Paresh Patel

(57) ABSTRACT

A test device for testing a semiconductor device including a TSV may comprise a ring oscillator including a plurality of inverters, a switch selectively connecting an output node of an inverter of the plurality of inverters and the TSV, and a controller controlling the switch.

8 Claims, 14 Drawing Sheets

TEST DEVICE, SEMICONDUCTOR DEVICE AND TESTING METHOD THEREOF

CROSS-REFERENCE TO RELATED APPLICATIONS

The present application claims priority of Korean Patent Application No. 10-2012-0088725, filed on Aug. 14, 2012, which is incorporated herein by reference in its entirety.

BACKGROUND

1. Technical Field

Embodiments of the present invention relate to a test device for testing a semiconductor device, a semiconductor device, a semiconductor device and a testing method thereof and more particularly to a test device for testing a semiconductor device, a semiconductor device and a testing method thereof to test whether a TSV (Thru Silicon Via) included in a semiconductor device is formed without defects such as a crack therein and whether the TSV is connected to a metal layer or not.

2. Related Art

FIG. 1 illustrates a semiconductor device 7 comprising a semiconductor substrate 1 including a TSV 3 and an upper structure 4 formed on the semiconductor substrate 1.

An insulator layer 2 is formed between the semiconductor substrate 1 and the TSV 3. The upper structure 4 includes a metal layer 5 connected to the TSV 3 and an insulating layer 6.

A test process is performed when manufacturing a semiconductor device to test for defects such as whether a metal layer 5 is connected to a TSV 3 and/or whether a TSV 3 is formed without a crack therein.

In a conventional process, the semiconductor substrate 1 is ground to expose the bottom of the TSV 3 and the resistance between the exposed TSV 3 and the metal layer 5 was measured to test connectivity between the metal layer 5 and TSV 3 and/or to test for the presence of defects such as a crack in the TSV 3.

The grinding and measuring resistance add cost and complexity to the manufacturing process.

SUMMARY

Various embodiments are directed to a test device for testing a semiconductor device, a semiconductor device and a testing method thereof to test for defects such as whether a TSV is formed without any crack therein and whether a TSV is connected to a metal layer or not.

In an embodiment, a test device for testing a semiconductor device including a TSV may comprise a ring oscillator including a plurality of inverters, a switch selectively connecting an output node of an inverter of the plurality of inverters to the TSV, and a controller controlling the switch.

The test device may further comprise a counter counting a clock signal output from the ring oscillator.

The controller of the device may control the switch to disconnect the node from the TSV for a first time period and may control the switch to connect the node to the TSV for a second time period, and the controller may test the TSV with a first counter value of the counter for the first time period and a second counter value of the counter for the second time period.

The controller of the test device may determine the TSV is normal if a difference between the first counter value and the second counter value is greater than a threshold value.

In an embodiment, a test device for testing a semiconductor device including N (an integer larger than 1) TSVs may comprise a ring oscillator including M (an integer not smaller than N) inverters, N switches connecting the N TSVs with output nodes of N inverters of the M inverters and a controller controlling the N switches.

In an embodiment, a test device for testing a semiconductor device including N (an integer larger than 1) TSVs may comprise a ring oscillator including M (an integer not smaller than N) inverters, N switches connecting the N TSVs with an output node of an inverter of the M inverters and a controller controlling the N switches.

In an embodiment, a test device for testing a semiconductor device including a plurality of TSVs may comprise a first ring oscillator outputting a first clock signal, a second ring oscillator outputting a second clock signal, a switch selectively connect a TSV among the plurality of TSVs with an output node of an inverter included in the first ring oscillator, a controller; and a frequency comparator comparing a first frequency of the first clock signal with a second frequency of the second clock signal, wherein the controller calibrates the first ring oscillator or the second ring oscillator so that the first frequency and the second frequency are substantially the same while the switch is turned off and the controller tests the TSV while the switch is turned on.

In an embodiment, a semiconductor device may comprise a semiconductor substrate including N (an integer larger than 1) TSVs, a ring oscillator including M (an integer not smaller than N) inverters, and N switches connecting the N TSVs with output nodes of N inverters of the M inverters.

In an embodiment, a semiconductor device may comprise a semiconductor substrate including N (an integer larger than 1) TSVs, a ring oscillator including M (an integer not smaller than N) inverters, and N switches connecting the N TSVs with an output node of an inverter of the M inverters.

In an embodiment, a method for testing a semiconductor device may comprise connecting a TSV with an output node of an inverter of a ring oscillator for a first time period, measuring a first frequency of the ring oscillator during the first time period, disconnecting the TSV with the output node for a second time period, measuring a second frequency of the ring oscillator during the second time period and comparing the first frequency and the second frequency.

In an embodiment, a method for testing a semiconductor device including a plurality of TSVs having substantially the same resistive and capacitive (RC) characteristics may comprise selecting a first TSV among the plurality of TSVs, measuring a first frequency of a ring oscillator with the first TSV connected with an output node of an inverter included in the ring oscillator, measuring a second frequency of the ring oscillator with the first TSV disconnected from the output node, determining whether the first TSV is normal by comparing the first frequency and the second frequency, measuring a third frequency of the ring oscillator with a second TSV among the plurality of TSVs connected with the output node, and determining whether the second TSV is normal by comparing the third frequency with the first frequency and/or the second frequency.

In an embodiment, a method for testing a semiconductor device may comprise calibrating a first ring oscillator and/or a second ring oscillator for the first ring oscillator and the second ring oscillator to have substantially same frequency with the second ring oscillator disconnected from the TSV, comparing a first frequency of a first clock signal from the first ring oscillator and a second frequency of a second clock signal from the second ring oscillator while the second ring oscillator is connected to the TSV; and determining a state of the TSV based on the result of the comparing.

DETAILED DESCRIPTION

Figure 1:
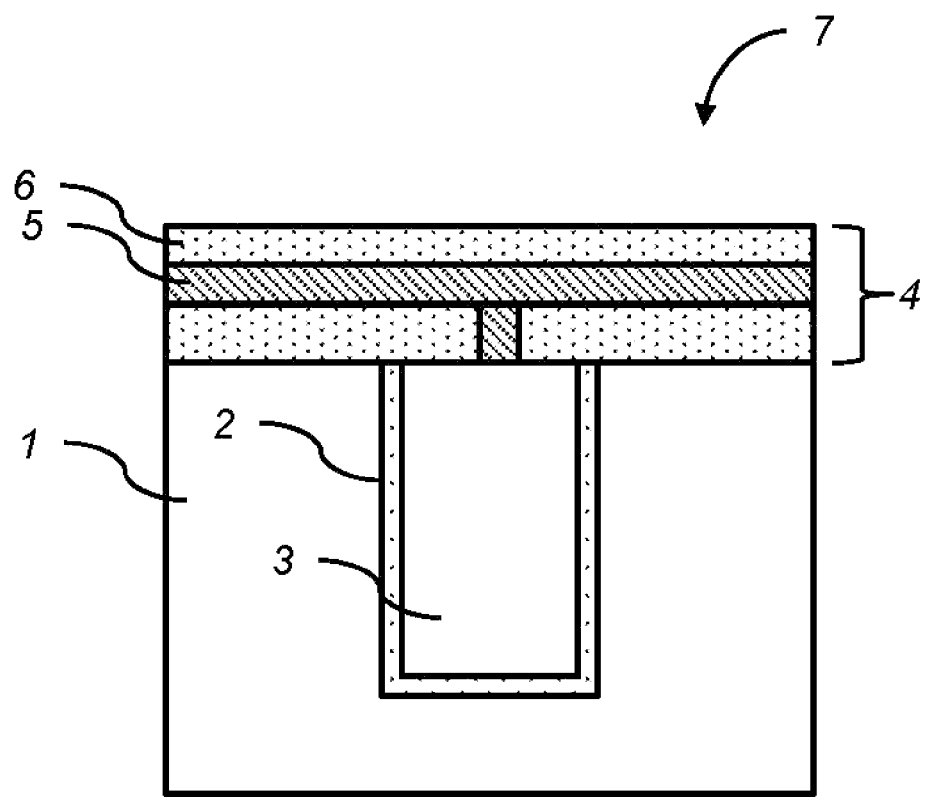
FIG. 1 illustrates a semiconductor device comprising a semiconductor substrate including a TSV formed therein and an upper layer including a metal layer.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
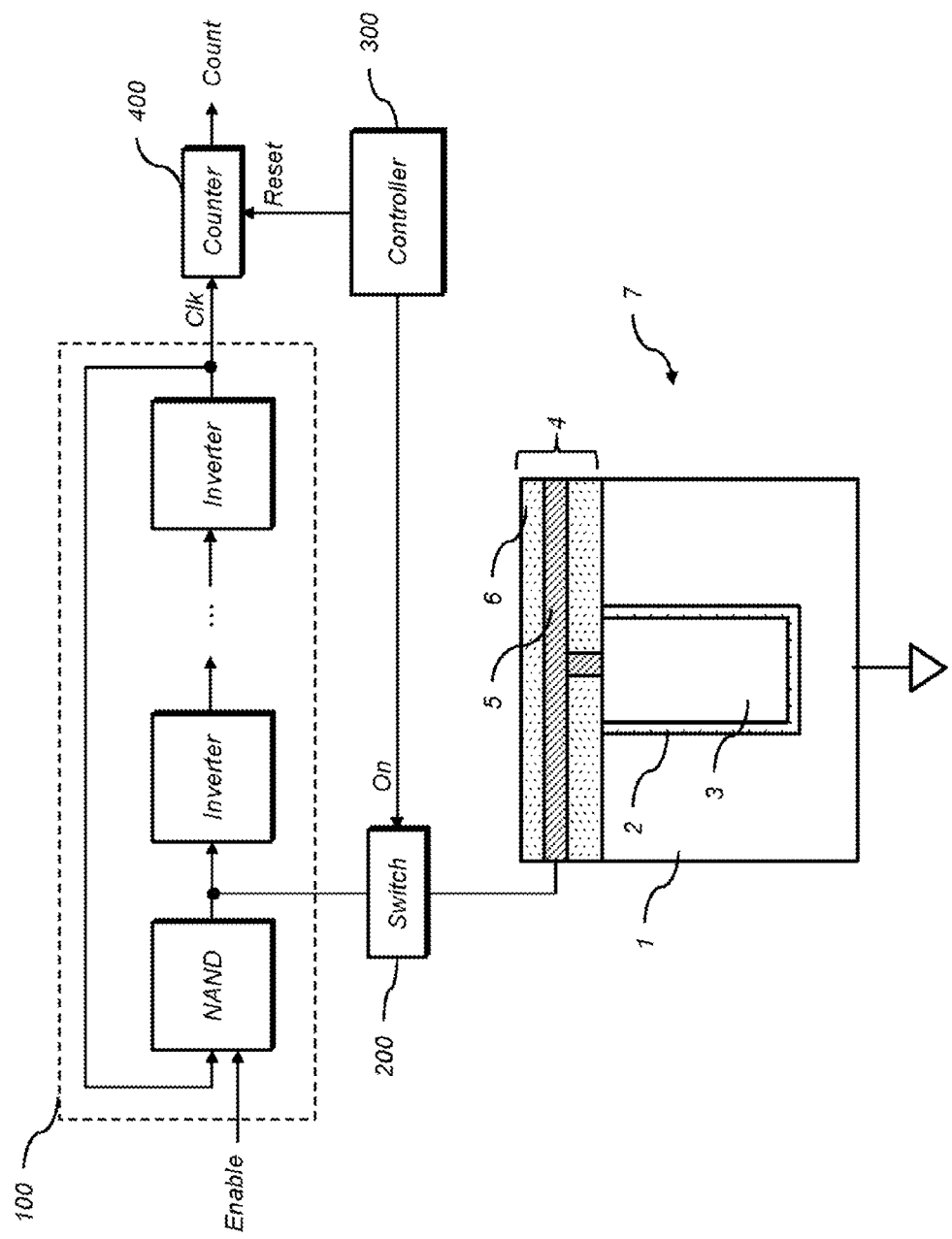
FIG. 2 illustrates a test device and a semiconductor device according to an embodiment of the present invention

FIG. 2 illustrates a test device and a semiconductor according to an embodiment of the present invention.

A test device according to an embodiment may include an oscillator 100 and a switch 200. The test device according to an embodiment may further include a controller 300 for controlling the switch 200. The test device according to an embodiment may further include a counter 400 counting the clock signal Clk from the oscillator 100 controlled by the controller 300.

In an embodiment, the oscillator 100 may be a ring oscillator whose frequency may be controlled by the delay between any two elements. Oscillator 100 may include a NAND gate and a plurality of inverters.

The ring oscillator may oscillate when the enable signal Enable is high and may not oscillate when the enable signal Enable is low. The enable signal Enable may be provided by the controller 300. The NAND gate may function as an inverter when the enable signal Enable is high. In the following description, an inverter may designate an inverter gate or the NAND gate which functions as an inverter when the enable signal is high.

The frequency of the clock signal Clk output from the ring oscillator 100 may depend on the delay of a signal transmitted between any two inverters therein.

A switch 200 may connect a node between any two inverters with a metal layer 5 which is connected to a TSV 3. Switch 200 may be controlled by a control signal On from the controller 300. When the control signal On is asserted, switch 200 operates to electrically connect metal layer 5 and TSV 3 to the node. When the control signal On is not asserted, switch 200 operates to electrically isolate metal layer 5 and TSV 3 from the node.

Figure 3:
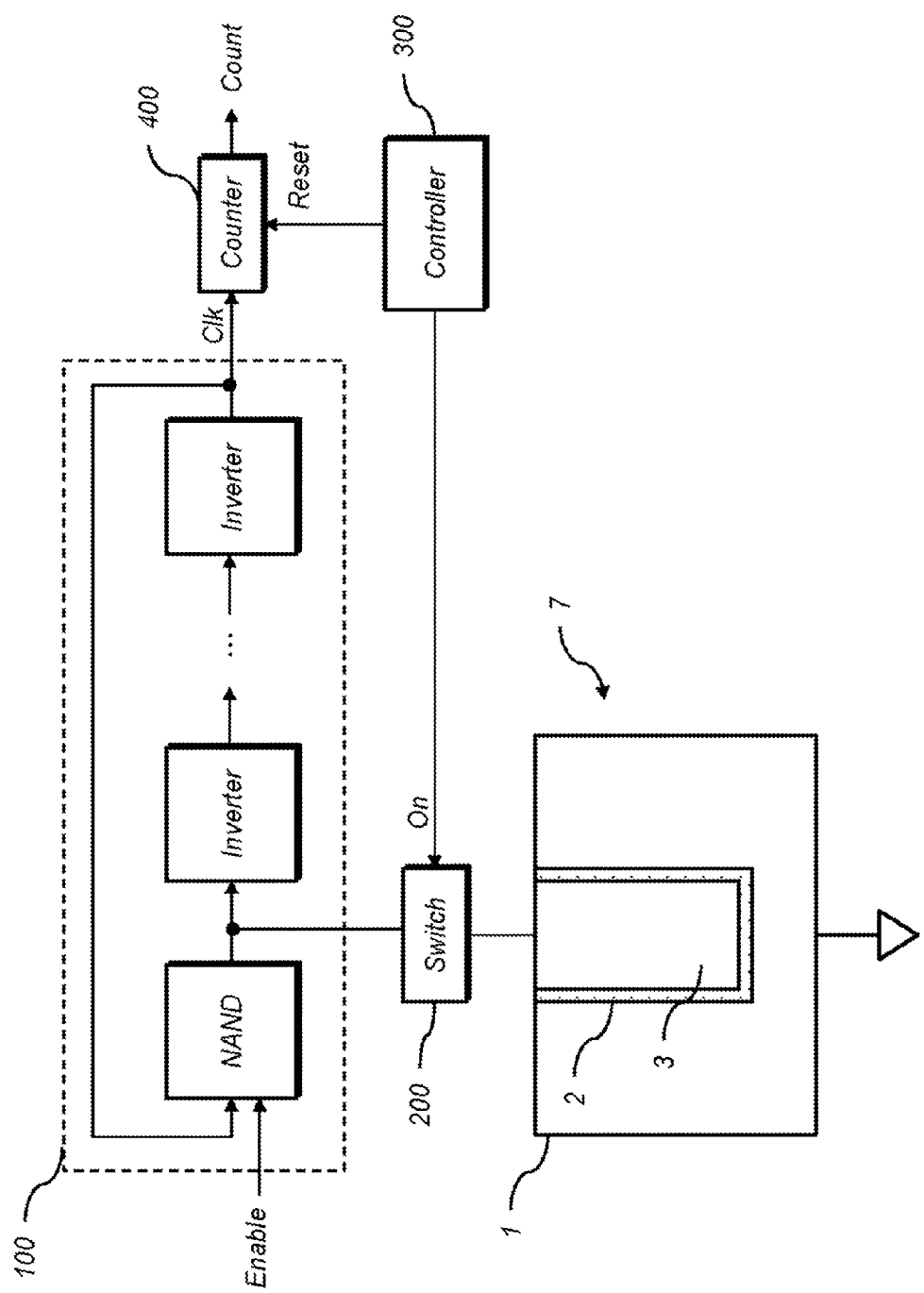
FIG. 3 illustrates a test device and a semiconductor device according to another embodiment of the present invention

FIG. 3 illustrates a test device and a semiconductor according to another embodiment of the present invention.

The embodiment in FIG. 3 is substantially the same as the embodiment in FIG. 2 except that the switch 200 may directly connect a node between any two inverters to a TSV 3 according to the state of a control signal On from the controller 300.

Figure 4:
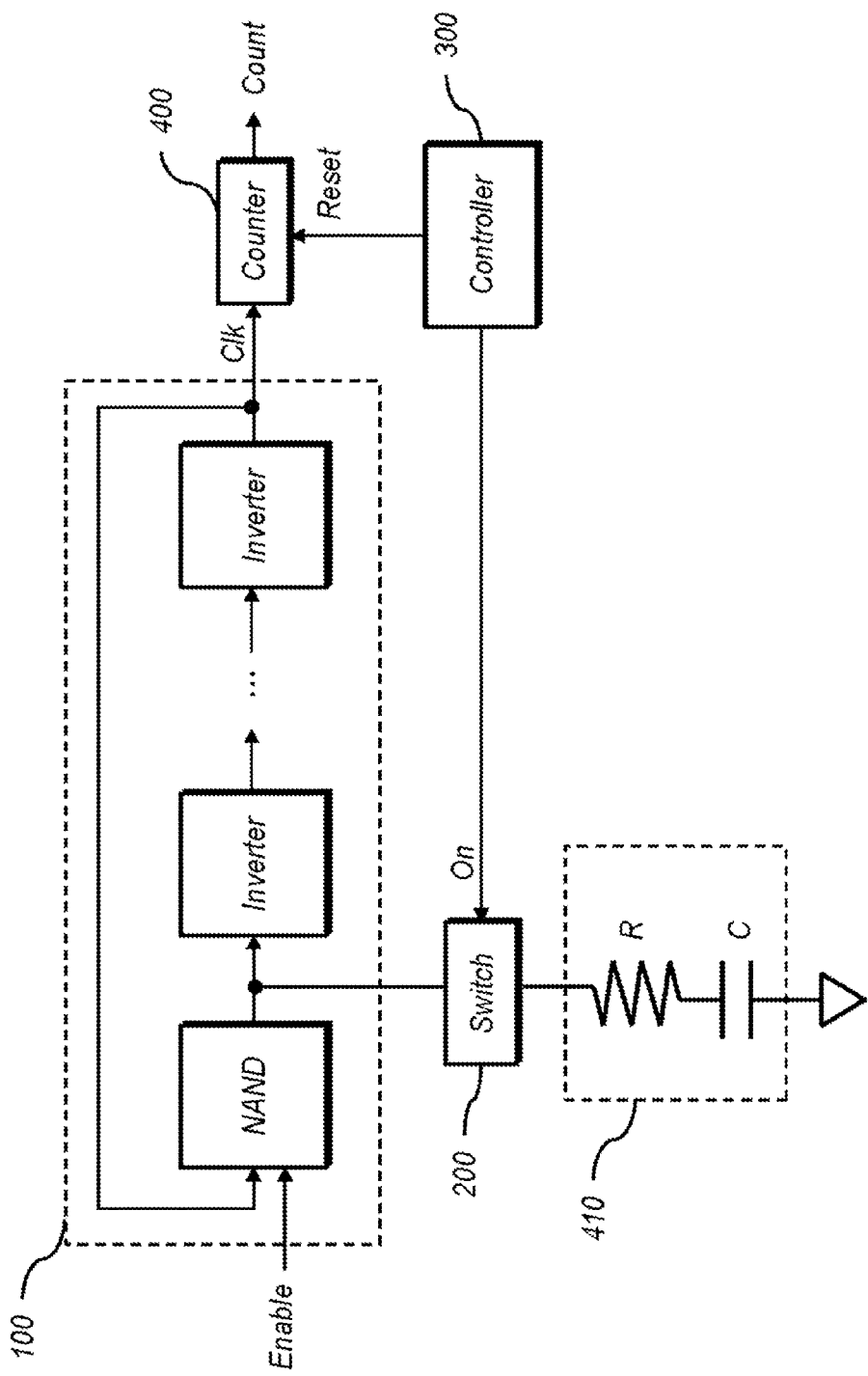
FIG. 4 illustrates a test device and an equivalent circuit of the semiconductor device according to embodiments of FIG. 2 and FIG. 3.

FIG. 4 illustrates a test device and an equivalent circuit 410 of the semiconductor device which is connected to the switch 200 in the embodiments of FIG. 2 and FIG. 3.

During the test period the semiconductor substrate 1 may be grounded. The semiconductor device 7 including the TSV 3 and/or the upper structure 4 may be an electrical equivalent of a capacitor C and a resistor R formed by the semiconductor substrate 1, the insulator 2 and the TSV 3. Accordingly, some of the figures show a resistor/capacitor structure to represent a semiconductor device, and the specification refers to an equivalent circuit 410 to represent electrical properties of a semiconductor device.

If the TSV 3 and the metal layer 5 are normally formed without defects, a closed circuit may be formed from node between the two inverters of the ring oscillator 100 to the ground via the equivalent circuit 410 when switch 200 is turned on.

If the TSV 3 and the metal layer 5 are not normally formed and accordingly have a defect therein, the defect may prevent a closed circuit from being formed from the node between the two inverters of the ring oscillator 100 to the ground via the equivalent circuit 410 when the switch 200 is turned on. Although embodiments are described as detecting the specific defect of a crack in a TSV, persons of skill in the art will recognize that embodiments could be used to detect the presence of other defects as well.

When a closed circuit is formed between a node between two inverters of the ring oscillator 100 and a ground, the oscillation frequency of the ring oscillator 100 may decrease according to the signal delay between the inverters.

The counter 400 may count the clock signal Clk from the ring oscillator 100. The counter 400 according to an embodiment of the present invention may measure a frequency of the clock signal Clk from the ring oscillator 100.

In other embodiments other elements instead of the counter 400 may be adopted to measure the frequency of the clock signal Clk from the ring oscillator 100.

In the embodiments in FIG. 2 and FIG. 3, one or more elements among the ring oscillator 100, the switch 200, the controller 300 and the counter 400 was described as being included in a test device. In some embodiments, these elements are present in a test device that is physically separate from the semiconductor device that is being tested. However, in other embodiments, any one or more elements among the ring oscillator 100, the switch 200, the controller 300 and the counter 400 may be included in a semiconductor device 7 along with the semiconductor substrate 1 and the upper structure 4. In other words, in various embodiments, one or more component of a test device may integrated with semiconductor device 7.

Figure 5:
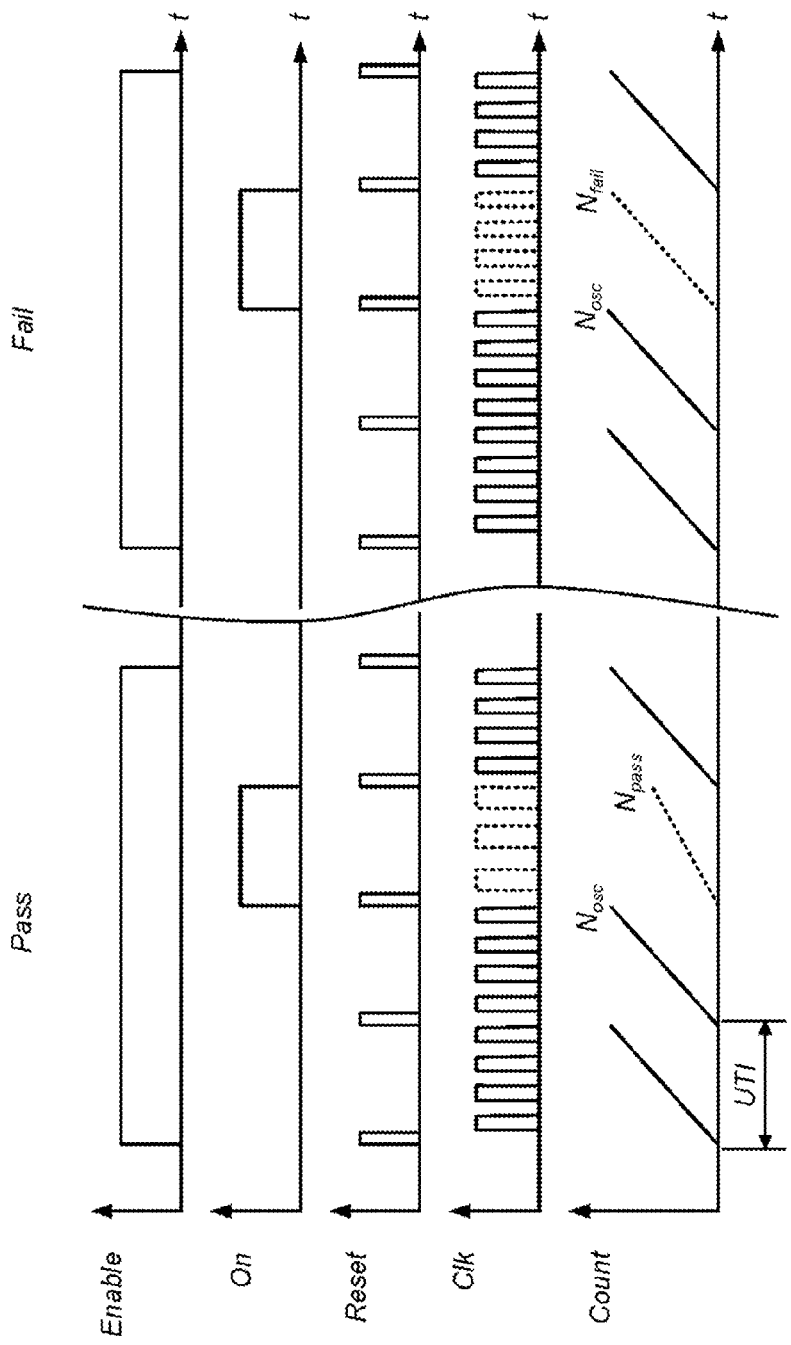
FIG. 5 is a graph illustrating a test method and test result according to an embodiment of the present invention.

FIG. 5 is a graph illustrating a test method and test result according to an embodiment of the present invention.

In an embodiment, controller 300 turns switch 200 on for a first time period and turns switch 200 off for a second time period. During the first time period and the second time period the counter may count the clock signal Clk from the ring oscillator 100.

In the embodiment shown in FIG. 5, the first time period and the second time period may have a same length which is illustrated as a UTI (Unit Time Interval). The Controller 300 may reset the counter 400 after the UTI.

If the metal layer 5 and the TSV 3 are connected to each other and defects are not present in the TSV 3, the frequency of the clock signal Clk from the ring oscillator 100 with the switch 200 turned on may be smaller than the frequency of the clock signal Clk from the ring oscillator 100 with the switch 200 turned off because of the additional RC delay caused by the equivalent circuit 410 in FIG. 4.

Therefore, when the counter value $N_{osc}$ measured with the switch 200 turned off is larger than the counter value $N_{pass}$ measured with the switch 200 turned on, the test may be considered successful as shown in the left side of the graph.

When the first time period is different from the second time period, whether the test passes or fails may be determined by considering the counter values and the lengths of the first and the second time periods. For example, an embodiment may establish ratios between counter values and time periods, and compare ratios corresponding to different time periods.

If the metal layer 5 and the TSV 3 are not connected or there is a crack in the TSV 3, the frequency of clock signal Clk from the ring oscillator 100 may have substantially the same value regardless of the states of the switch 200. Therefore, when the counter value $N_{osc}$ measured with the switch 200 turned off and the counter value $N_{fail}$ measured with the switch 200 turned on are substantially the same, the test may be considered a failure as shown in the right side of the graph.

In an embodiment, when the difference between the counter values Nosc and Npass are greater than a predetermined threshold, the test may be considered successful. The threshold value may be determined by a person of ordinary skill in the art by considering parameters such as the first time period and the second time period.

Figure 6:
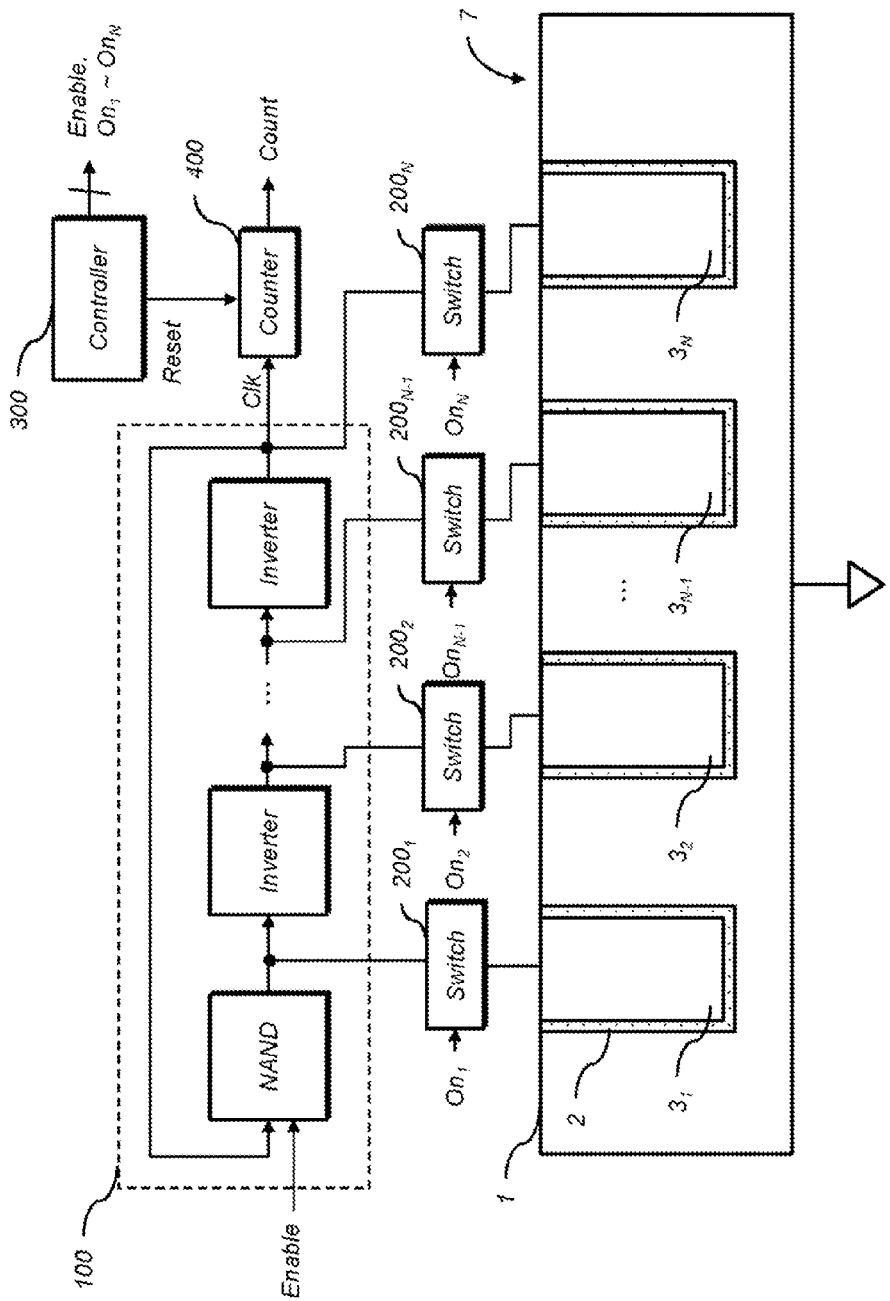
FIG. 6 illustrates a test device and a semiconductor device according to another embodiment of the present invention.

FIG. 6 illustrates a test device and a semiconductor device according to another embodiment of the present invention.

The test device in the embodiment in FIG. 6 may include a plurality of inverters in the ring oscillator 100 and a plurality of switches 200. The test device may further include a controller 300 to control on and off positions of the switches $200_1\sim200_N$. The test device may further include a counter 400 to count the clock signal Clk from the ring oscillator 100.

The semiconductor substrate 1 may include a plurality of TSVs 3 each of which connected to a respective switch among the plurality of switches $200_1\sim200_N$.

The test method of the embodiment of FIG. 6 may be basically as same as that explained with reference to the graph in FIG. 5. In the embodiment of FIG. 6, each switch $200_1\sim200_N$ is turned on and is turned off by the controller 300. Therefore, switch positions may be changed 2N times to test N TSVs in a semiconductor device 1.

Even though the embodiment of FIG. 6 only shows one ring oscillator 100 and one counter 400, another embodiment may include a plurality of group ring oscillators and the plurality of counters for parallel testing, where each ring oscillator and corresponding counter may test a corresponding group of TSVs in the semiconductor substrate 1.

As illustrated in FIG. 6, one or more elements among the ring oscillator 100, the plurality of switches $200_1\sim200_N$, the controller 300, and the counter 400 may be included in a test device which is embodied outside of a semiconductor device 7 including a semiconductor substrate 1 and an upper structure 4. But in other embodiments one or more elements among the ring oscillator 100, the plurality of switches $200_1\sim200_N$, the controller 300, and the counter 400 may be included in a semiconductor device 7 that includes the TSV 3, so that the semiconductor device may test itself.

Figure 7:
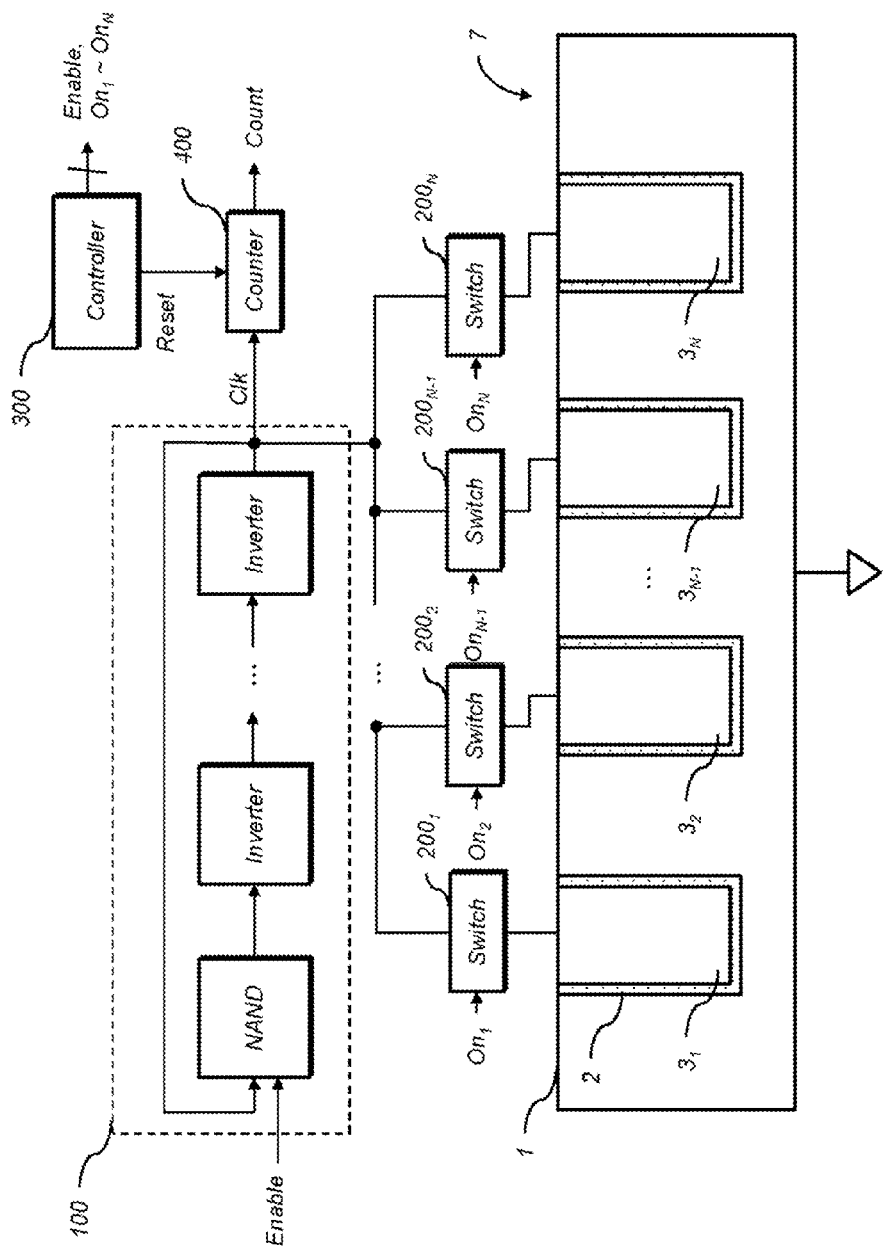
FIG. 7 illustrates a test device and a semiconductor device according to another embodiment of the present invention.

FIG. 7 illustrates a test device and a semiconductor device according to another embodiment of the present invention.

In the embodiment of FIG. 7, all switches $200_1\sim200_N$ connect a plurality of TSVs with the same node between two inverters of the ring oscillator 100.

In the embodiment of FIG. 7, all switches $200_1\sim200_N$ are connected to the same node of the ring oscillator 100. Therefore, as long as the TSVs are considered to have substantially the same RC characteristics, the testing may be accomplished with less switching operations. For example, TSVs which are formed using the same manufacturing process to have the same cross sectional area and the same length may be assumed to have substantially the same RC characteristics.

For example it is assumed that a switch among switches $200_1\sim200_N$ which are connected to TSVs which have substantially same RC characteristics is selected as a representative switch.

The representative switch is turned on for a first time period and the representative switch is turned off for a second time period. By comparing the counter values counted by the counter 400, the presence of a defect such as a crack in the TSV connected to the representative switch may be determined.

Each of other TSVs that are connected to switches other than the representative switch may be tested by counting the clock signal Clk from the ring oscillator 100 for a third time period with the corresponding switch turned on. The counter value for the third time period may be compared with the counter values for the first and the second time periods to test the corresponding TSV. That is, in an embodiment, switches other than the representative switch do not need to be turned off for testing, which reduces total test time.

Figure 8:
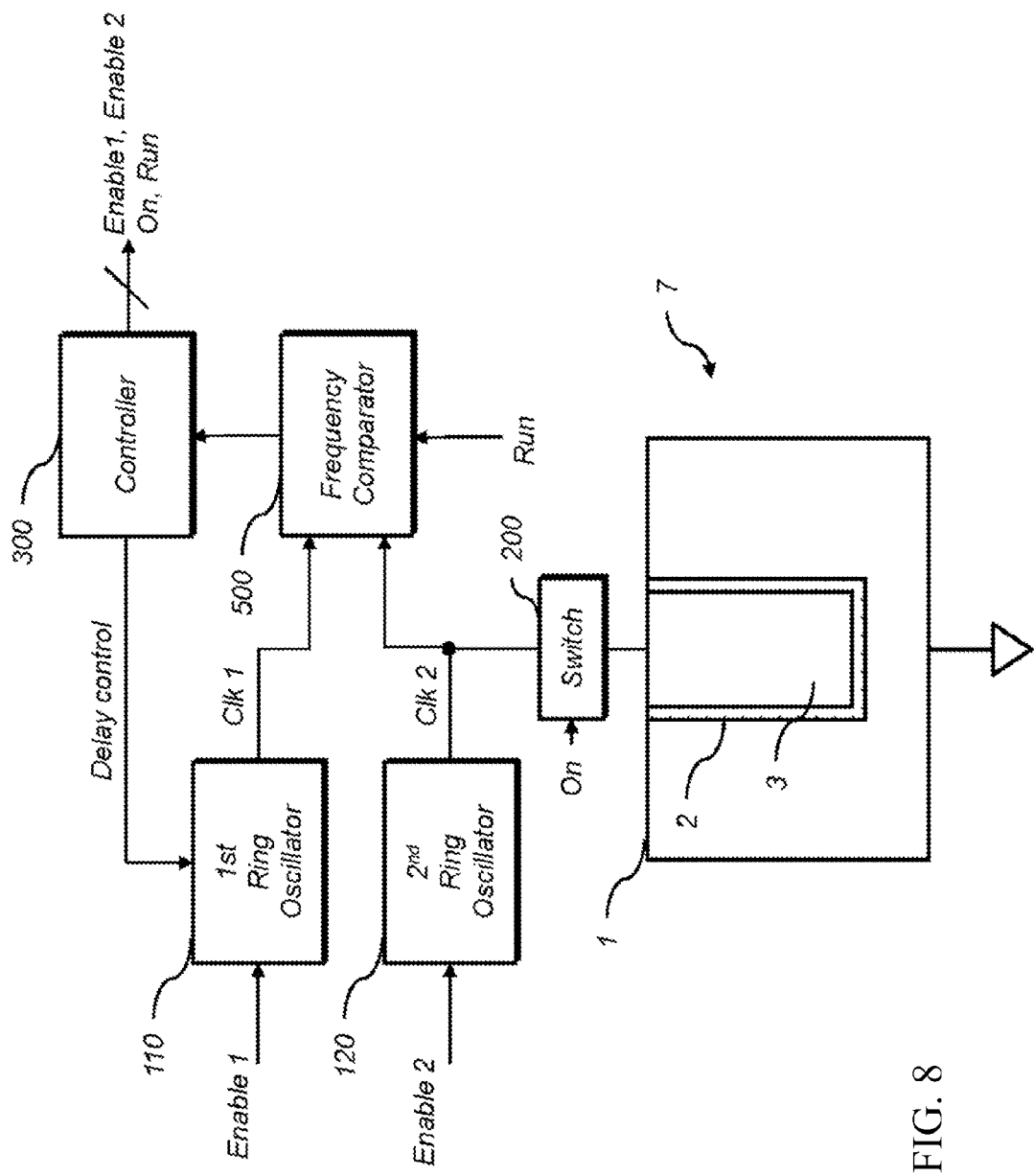
FIG. 8 illustrates a test device and a semiconductor device according to another embodiment of the present invention.

FIG. 8 illustrates a test device and a semiconductor device according to another embodiment of the present invention.

In the embodiment of FIG. 8, the test device may include a first ring oscillator 110 and a second ring oscillator 120, a switch 200, a controller 300 and a frequency comparator 500.

The first ring oscillator 110 and the second ring oscillator 120 are calibrated to have the same frequency while the switch is turned off. The first ring oscillator 110 may include a controllable delay line to calibrate its frequency controlled by the controller 300.

During calibration the controller 300 turns off the switch 200 and enables the first ring oscillator 110 and the second ring oscillator 120. The frequency comparator 500 compares the clock signal Clk1 from the first ring oscillator 110 and the clock signal Clk2 from the second ring oscillator 120 and provides the comparison result to the controller 300. The controller 300 feedback controls the first ring oscillator until the frequency comparator 500 signals that clock signals Clk1 and Clk2 have the same frequency.

Figure 9:
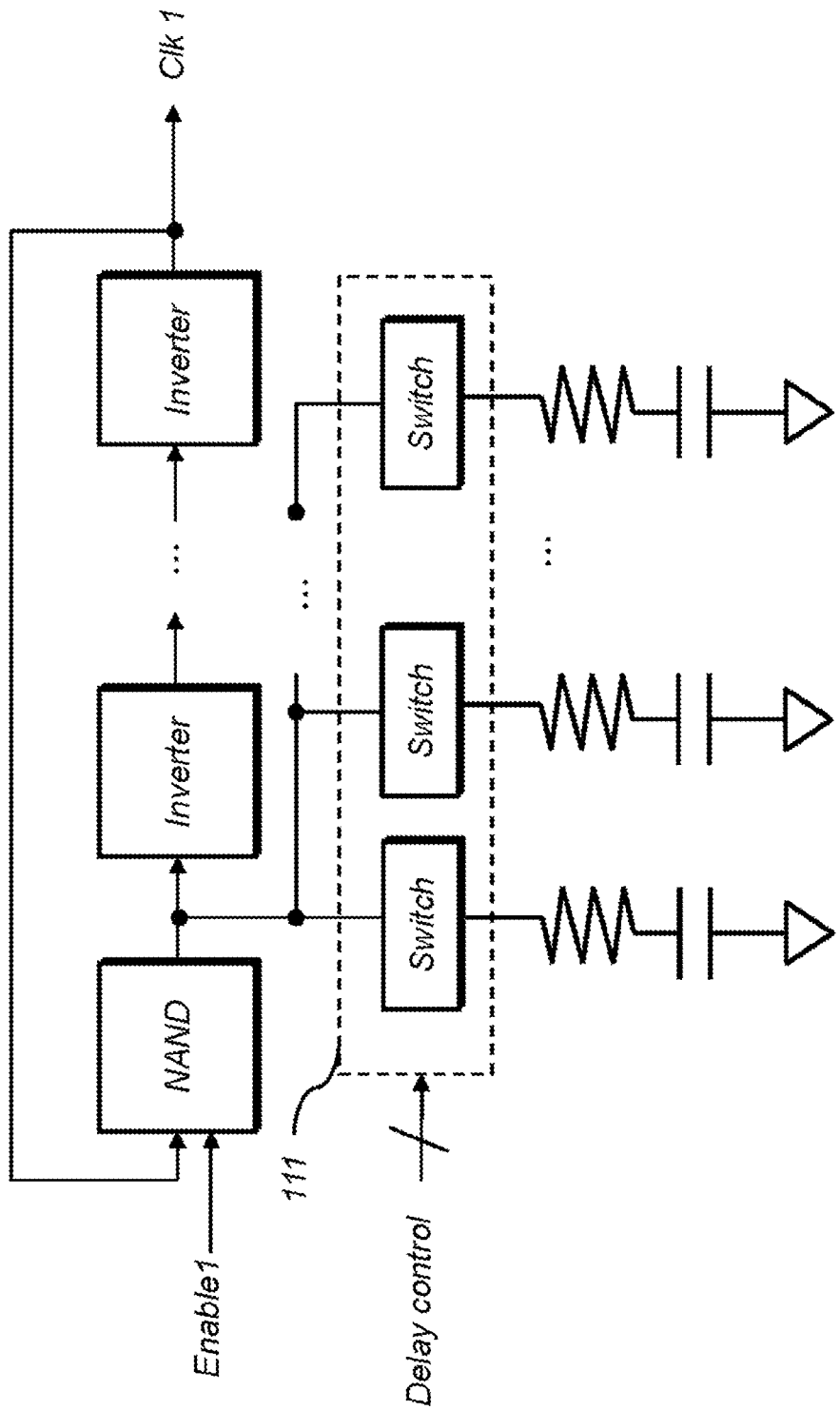
FIG. 9 is a block diagram of a first ring oscillator 110 of FIG. 8.

FIG. 9 is a block diagram showing the first ring oscillator 110 according to an embodiment of the present invention. The first ring oscillator may include a plurality of switches 111 each connecting an RC delay circuit with an output node from the NAND gate. The control signal Delay control from the controller 300 controls the plurality of switches 111 to select one or more RC delay circuits to be connected to the output node of the NAND gate in the first ring oscillator 110, thereby adjusting the frequency of the clock signal Clk1 from the first ring oscillator 110.

Figure 10:
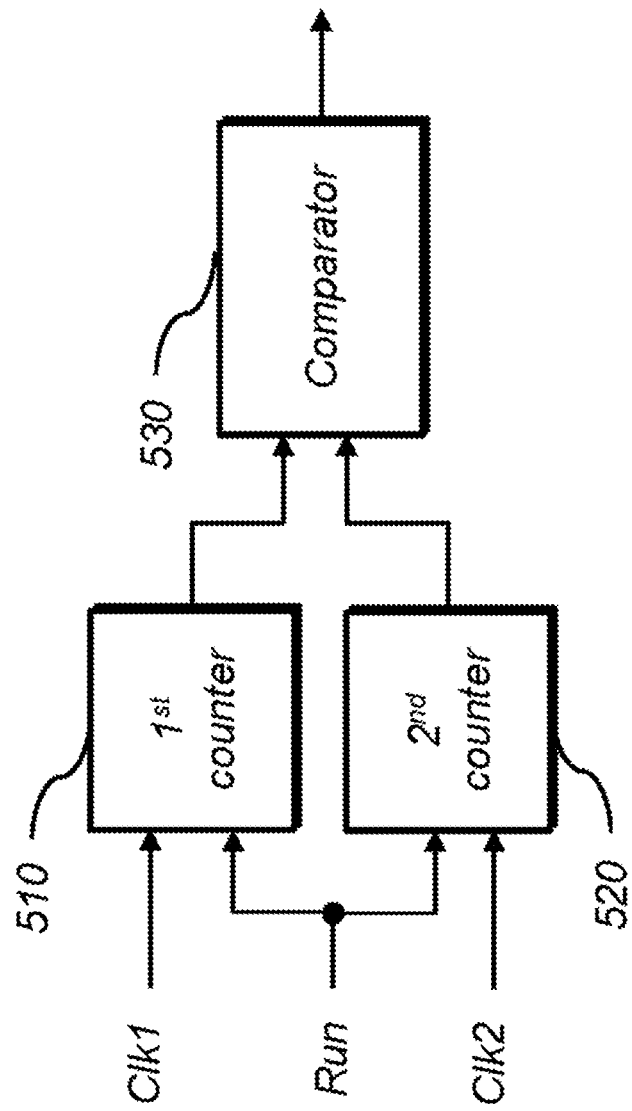
FIG. 10 is a block diagram of a frequency comparator 500 of FIG. 8.

FIG. 10 is a block diagram of the frequency comparator 500 according to an embodiment of the present invention. The frequency comparator 500 may include a first counter 510, a second counter 520 and a comparator 530. The first counter 510 counts the clock signal Clk1 from the first ring oscillator 510 and the second counter 520 counts the clock signal Clk2 from the second ring oscillator 520 when the control signal Run from the controller 300 is enabled. The comparator 530 compares the outputs from the first counter 510 and from the second counter 520. In an embodiment, a same counter value represents a same frequency and a smaller counter value represents a smaller frequency.

After the calibration, the controller 300 begins to test the TSV 3. During the test period, the controller 300 turns on the switch 200 and enables the first ring oscillator 110 and the second ring oscillator 120. If the frequency comparator 500 notifies the controller that clock signal Clk1 from the first ring oscillator 110 and the clock signal Clk2 from the second ring oscillator 120 have the same frequency, the controller 300 determines that the TSV 3 has a crack therein. If the frequency comparator 500 notifies the controller that the clock signal Clk1 from the first ring oscillator 110 has a higher frequency than the clock signal Clk2 from the second ring oscillator 120, the controller 300 determines that the TSV 3 does not have a crack therein.

FIG. 8 illustrates an embodiment which may test many TSVs after calibrating the first ring oscillator 110. Thus the embodiment in FIG. 8 may be useful to test a semiconductor device with many TSVs.

Though the embodiment of FIG. 8 illustrates that the controller 300 calibrates the first ring oscillator 110 based on the second ring oscillator 120, variations are possible in other embodiments. For example, in another embodiment, the controller 300 calibrates the second ring oscillator 120 based on the first ring oscillator 110.

Figure 11:
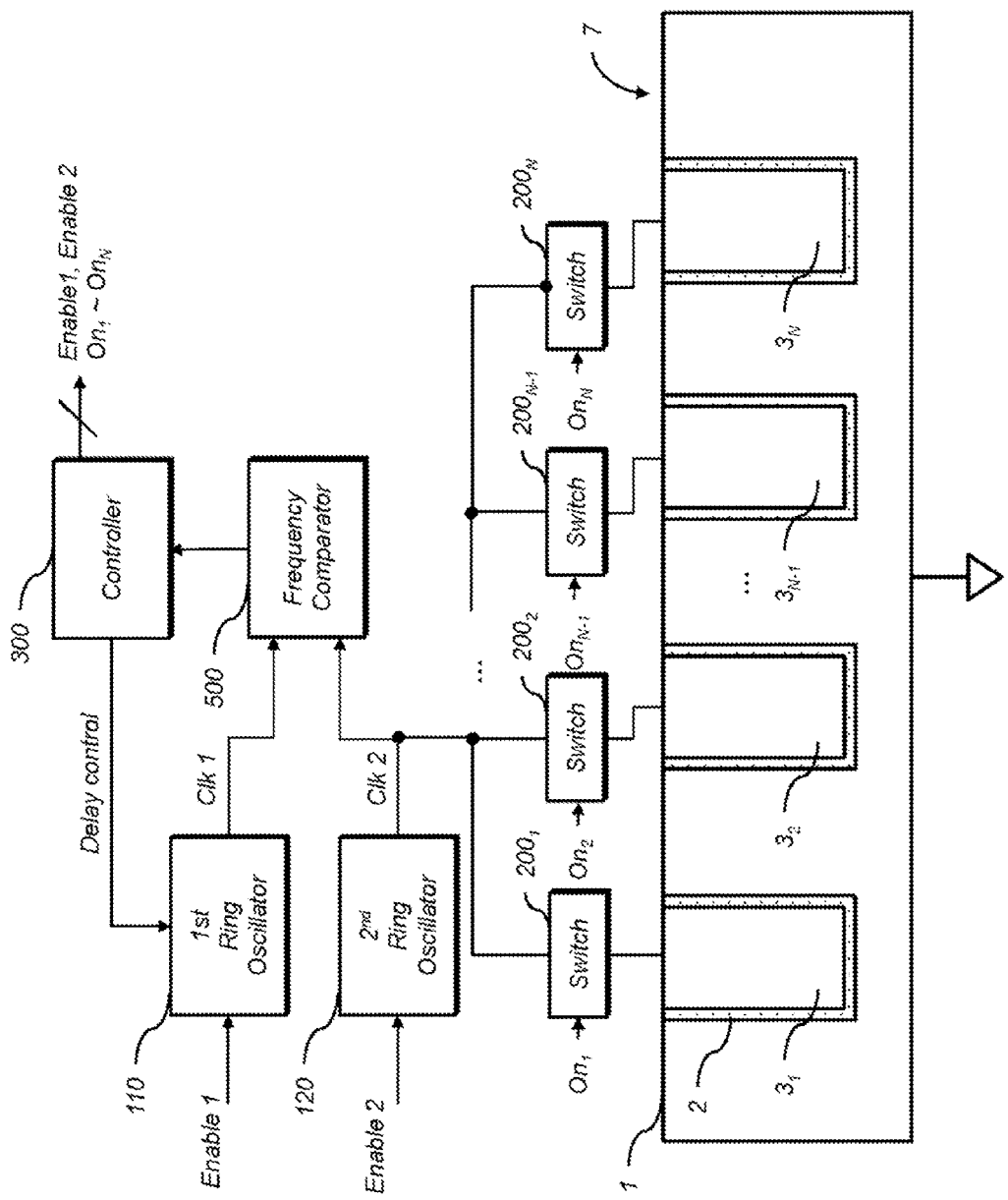
FIG. 11 illustrates a test device and a semiconductor device according to another embodiment of the present invention.

FIG. 11 illustrates a test device and a semiconductor device according to another embodiment of the present invention.

The embodiment shown in FIG. 11 is substantially the same as the embodiment in FIG. 8 except the former has N switches $200_1$~$200_N$ and N TSVs in the semiconductor substrate 1 instead of one switch 200 and one TSV 3 in FIG. 11.

As described above, a calibration may be performed when clock signals Clk1 from the first ring oscillator 110 and Clk2 from the second ring oscillator 120 do not have the same frequency when all switches $200_1$~$200_N$ are turned off.

For testing each TSV, a corresponding switch is turned on and the other switches are turned off. Then the controller 300 determines whether the tested TSV has a crack therein according to the comparison result from the frequency comparator 500.

Figure 12:
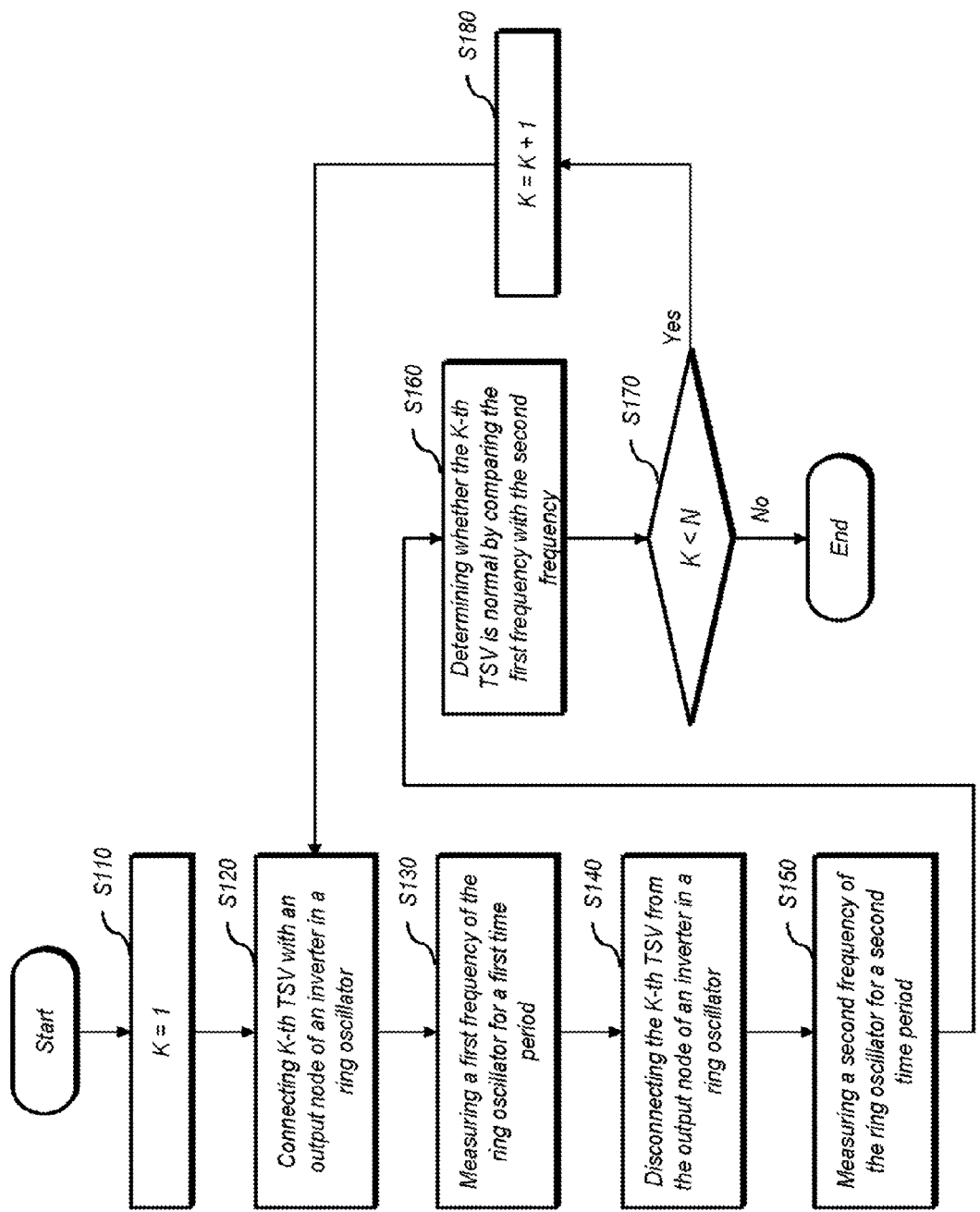
FIG. 12 is a flow chart illustrating a test method according to another embodiment of the present invention.

FIG. 12 is a flow chart illustrating a test method according to an embodiment of the present invention. FIG. 12 is related to a test method using a test device such as the device shown in FIG. 6.

In the embodiment, it is assumed that there are N TSVs to test. When the process starts, an index variable K is set to 1 at step S110.

The K-th TSV is connected to an output node of an inverter in a ring oscillator 100 at step S120.

A first frequency of a clock signal from the ring oscillator 100 is measured for a first time period at step S130.

The K-th TSV is disconnected from the output node at step S140.

A second frequency of a clock signal from the ring oscillator 100 is measured for a second time period at step S150.

It is determined whether the K-th TSV is normal by comparing the first frequency and the second frequency at step S160.

The index is compared with N at step S170.

If K is smaller than N, the index K is increased by one at step S180 and the process proceeds to step S120. If K is not smaller than N, the test process ends.

Figure 13:
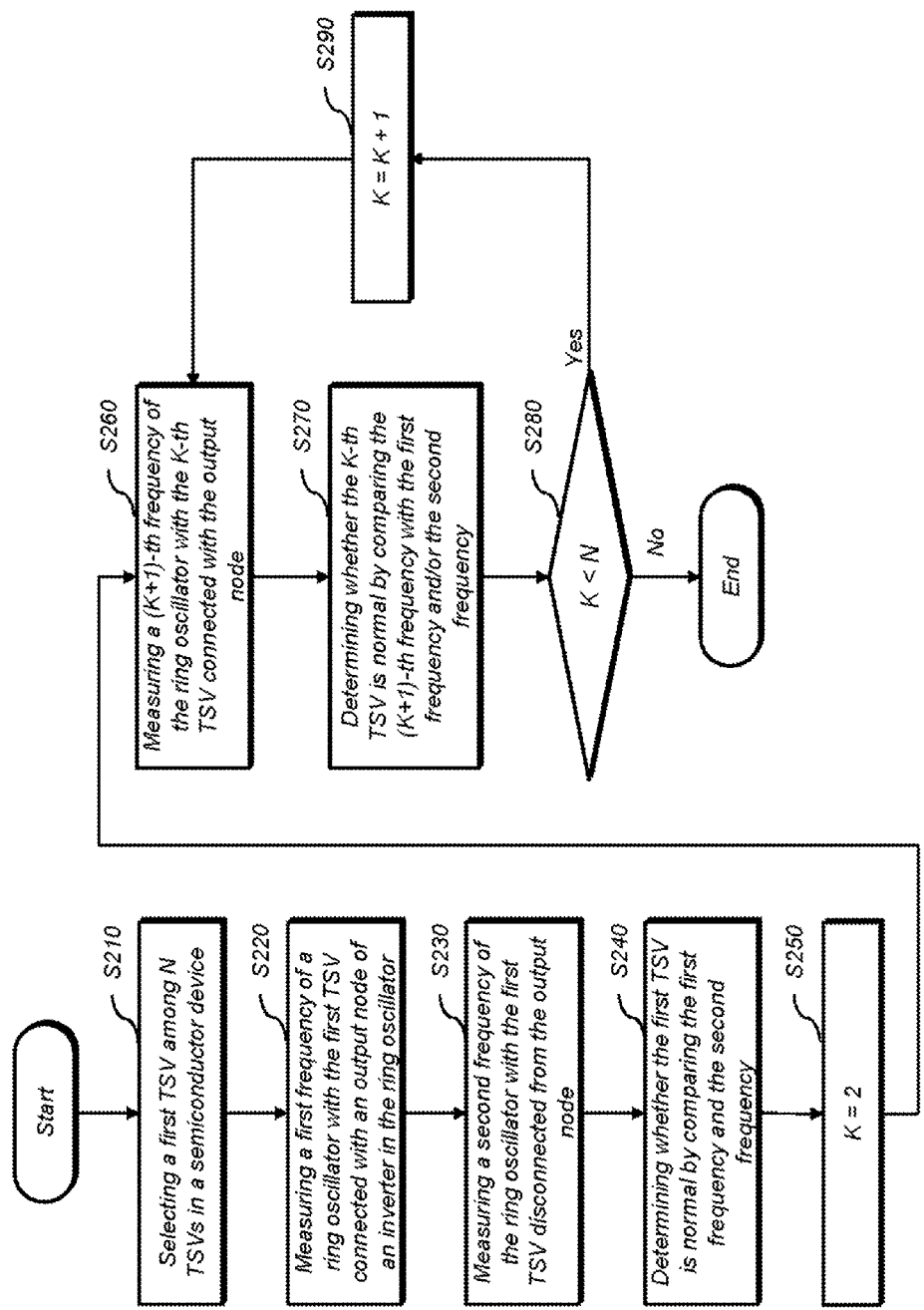
FIG. 13 is a flow chart illustrating a test method according to another embodiment of the present invention.

FIG. 13 is a flow chart illustrating a test method according to another embodiment of the present invention. FIG. 13 is related to a test method using a test device such the device shown in FIG. 7.

In the embodiment, it is assumed that there are N TSVs to test. When the process starts, a first TSV among N TSVs in a semiconductor device 7 is selected at step S210.

A first frequency of a clock signal from the ring oscillator 100 is measured with the first TSV is connected with an output node of an inverter in the ring oscillator 100 at step S220.

A second frequency of a clock signal from the ring oscillator 100 is measured with the first TSV is disconnected from the output node at step S230.

It is determined whether the first TSV is normal by comparing the first frequency and the second frequency at step S240.

The index variable K is set to 2 in step S250.

A (K+1)-th frequency of a clock signal from the ring oscillator 100 is measured with the K-th TSV is connected with the output node at step S260.

It is determined whether the K-th TSV is normal by comparing the (K+1)-th frequency with the first frequency and/or the second frequency at step S270.

The index is compared with N at step S280.

If K is smaller than N, the index K is increased by one at step S290 and the process proceeds to step S260. If K is not smaller than N, the test process ends.

Figure 14:
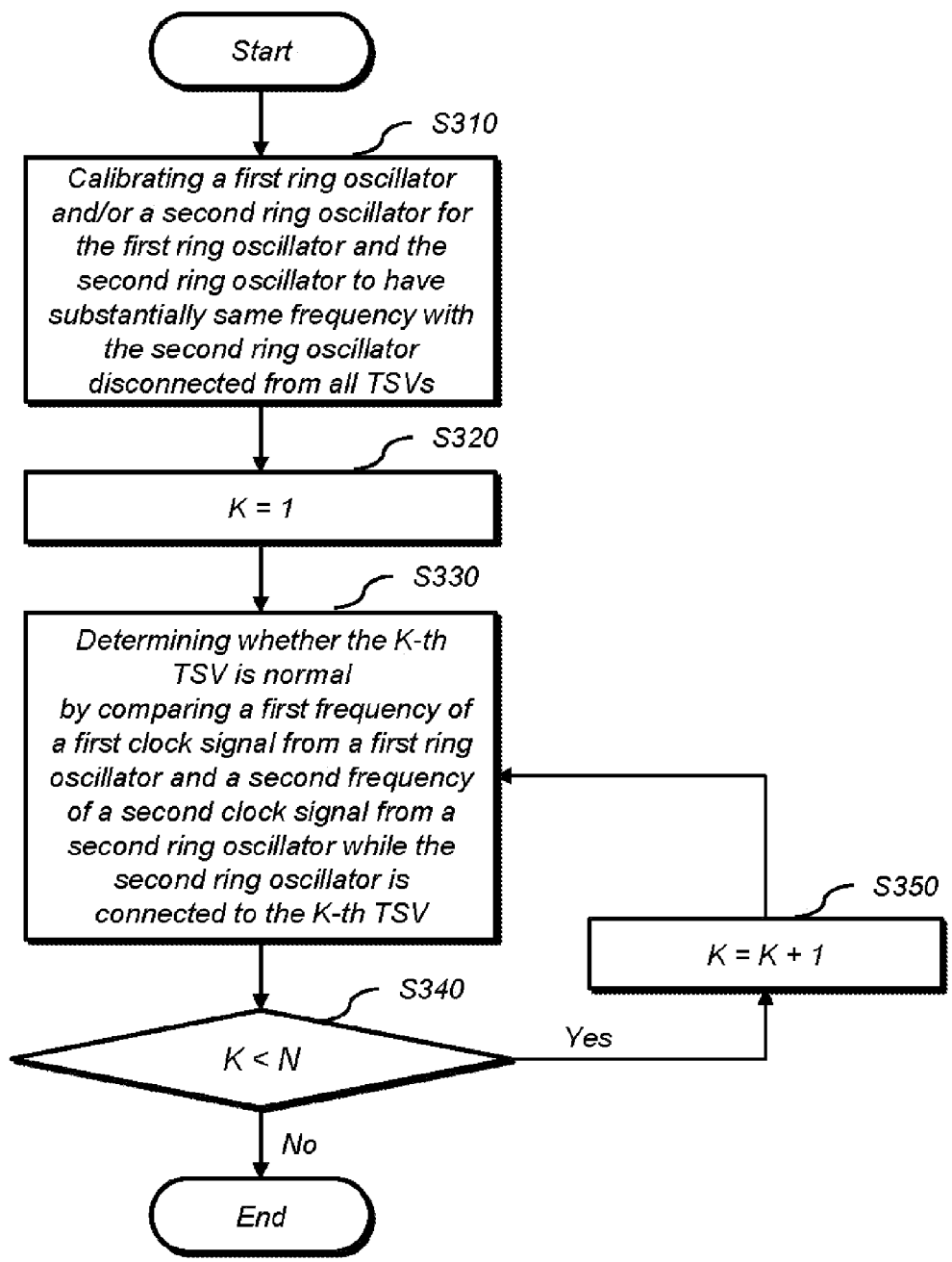
FIG. 14 is a flow chart illustrating a test method according to another embodiment of the present invention.

FIG. 14 is a flow chart illustrating a test method according to another embodiment of the present invention. FIG. 14 is related to a test method using a test device in FIG. 11.

It is assumed there are N TSVs to test. When the process starts at step S310, the controller 300 operates to calibrate a first ring oscillator 110 and/or a second ring oscillator 120 so that the first ring oscillator 110 and the second ring oscillator 120 have substantially the same frequency when the second ring oscillator 120 is disconnected from all TSVs.

An index variable K is set to 1 at step S320.

It is determined whether the K-th TSV is normal by comparing a first frequency of a first clock signal from the first ring oscillator 110 and a second frequency of a second clock signal from the second ring oscillator 120 while the second ring oscillator 120 is connected with the K-th TSV at step S330.

The index is compared with N at step S340

If K is smaller than N, the index K is increased by one at step S350 and the process proceeds to step S330. If K is not smaller than N, the test process ends.

Although various embodiments have been described for illustrative purposes, it will be apparent to those skilled in the art that various changes and modifications may be made without departing from the spirit and scope of the invention as defined in the following claims.

What is claimed is:

1. A test device for testing a semiconductor device including a through silicon via (TSV), the test device comprising:
    a ring oscillator including a plurality of inverters;
    a counter counting a clock signal output from the ring oscillator;
    a switch selectively connecting an output node of an inverter of the plurality of inverters with the TSV; and
    a controller controlling the switch to disconnect the node and the TSV for a first time period and to connect the node and the TSV for a second time period,
    wherein the controller tests the TSV by comparing a first counter value of the counter for the first time period to a second counter value of the counter for the second time period, and the controller determines that the TSV has passed a test when a difference between the first counter value and the second counter value is greater than a threshold value.

2. A test device for testing a semiconductor device including N TSVs, the test device comprising:
    a ring oscillator including M inverters;
    a counter counting a clock signal output from the ring oscillator;
    N switches connecting the N TSVs with output nodes of N inverters of the M inverters; and
    a controller controlling the N switches to disconnect a Kth node and a Kth TSV for a first time period and to connect the Kth node and the Kth TSV for a second time period,
    wherein the controller tests the Kth TSV by comparing a first counter value of the counter for the first time period to a second counter value of the counter for the second time period, and the controller determines that the Kth TSV has passed a test when a difference between the first counter value and the second counter value is greater than a threshold value, and
    wherein N is an integer greater than 1, K is an integer from 1 to N, and M is an integer that is equal to or greater than N.

3. A test device for testing a semiconductor device including N TSVs, the test device comprising:
    a ring oscillator including M inverters;
    a counter counting a clock signal output from the ring oscillator;
    N switches connecting the N TSVs with an output node of an inverter of the M inverters; and
    a controller controlling the N switches to disconnect the output node and a Kth TSV for a first time period and to connect the output node and the Kth TSV for a second time period,
    wherein the controller tests the Kth TSV by comparing a first counter value of the counter for the first time period to a second counter value of the counter for the second time period, and the controller determines that the Kth TSV has passed a test when a difference between the first counter value and the second counter value is greater than a threshold value, and
    wherein N is an integer greater than 1, K is an integer from 1 to N, and M is an integer equal to or greater than N.

4. A test device for testing a semiconductor including a plurality of TSVs, the test device comprising:
    a first ring oscillator outputting a first clock signal;
    a second ring oscillator outputting a second clock signal;
    a first switch selectively connecting a TSV among the plurality of TSVs with an output node of an inverter included in one of the first and second ring oscillators;
    a controller; and
    a frequency comparator comparing a first frequency of the first clock signal with a second frequency of the second clock signal,
    wherein the controller calibrates at least one of the first ring oscillator and the second ring oscillator so that the first frequency and the second frequency are substantially the same while the first switch is turned off, and the controller tests the TSV while the first switch is turned on,
    wherein the frequency comparator comprises:
        a first counter counting the first clock signal;
        a second counter counting the second clock signal; and
        a comparator comparing a first counter value from the first counter and a second counter value from the second counter, and
    wherein the controller determines that the TSV has passed a test when a difference between the first counter value and the second counter value is greater than a threshold value.

5. The test device of claim 4, wherein the first ring oscillator includes a plurality of second switches each selectively connecting a delay element to the output node of the inverter in the first ring oscillator, and
    wherein the controller controls the plurality of second switches according to a comparison result from the frequency comparator while the controller calibrates the first ring oscillator.

6. The test device of claim 4, wherein the second ring oscillator includes a plurality of third switches each selectively connecting a delay element with the output node of the inverter in the second ring oscillator, and
    wherein the controller controls the plurality of third switches according to a comparison result from the frequency comparator while the controller calibrates the second ring oscillator.

7. A semiconductor device comprising:
    a semiconductor substrate including N TSVs;
    a ring oscillator including M inverters;
    a counter counting a clock signal output from the ring oscillator;
    N switches connecting the N TSVs with output nodes of N inverters of the M inverters; and
    a controller controlling the N switches to disconnect a Kth node and a Kth TSV for a first time period and to connect the Kth node and the Kth TSV for a second time period,
    wherein the controller tests the Kth TSV by comparing a first counter value of the counter for the first time period to a second counter value of the counter for the second time period, and the controller determines that the Kth TSV has passed a test when a difference between the first counter value and the second counter value is greater than a threshold value, and
    wherein N is an integer greater than 1, K is an integer from 1 to N, and M is an integer equal to or greater than N.

8. A semiconductor device comprising:
a semiconductor substrate including N TSVs,
a ring oscillator including M inverters;
a counter counting a clock signal output from the ring oscillator;
N switches connecting the N TSVs with an output node of an inverter of the M inverters; and
a controller controlling the N switches to disconnect the output node and a Kth TSV for a first time period and to connect the output node and the Kth TSV for a second time period,
wherein the controller tests the Kth TSV by comparing a first counter value of the counter for the first time period to a second counter value of the counter for the second time period, and the controller determines that the Kth TSV has passed a test when a difference between the first counter value and the second counter value is greater than a threshold value, and
wherein N is an integer greater than 1, K is an integer from 1 to N, and M is an integer equal to or greater than N.

* * * * *